(12) United States Patent
Hong

(10) Patent No.: US 7,777,169 B2
(45) Date of Patent: *Aug. 17, 2010

(54) IMAGER PIXEL WITH CAPACITANCE CIRCUIT FOR BOOSTING RESET VOLTAGE

(75) Inventor: Sungkwon C. Hong, Boise, ID (US)

(73) Assignee: Aptina Imaging Corporation, George Town, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/207,040

(22) Filed: Sep. 9, 2008

(65) Prior Publication Data

US 2009/0001255 A1    Jan. 1, 2009

Related U.S. Application Data

(63) Continuation of application No. 11/002,281, filed on Dec. 3, 2004, now Pat. No. 7,446,807.

(51) Int. Cl.
*H04N 5/335* (2006.01)

(52) U.S. Cl. ............ 250/208.1; 348/302; 348/308

(58) Field of Classification Search ............ 250/208.1; 348/302
See application file for complete search history.

(56) References Cited

U.S. PATENT DOCUMENTS

| | | | |
|---|---|---|---|
| 5,471,515 A | 11/1995 | Fossum et al. | |
| 5,619,262 A | 4/1997 | Uno | |
| 6,140,630 A | 10/2000 | Rhodes | |
| 6,204,524 B1 | 3/2001 | Rhodes | |
| 6,252,462 B1 | 6/2001 | Hoffman | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,730,897 B2 * | 5/2004 | Guidash | 250/208.1 |
| 6,850,278 B1 | 2/2005 | Sakurai et al. | |
| 6,852,591 B2 | 2/2005 | Rhodes | |
| 6,975,356 B1 | 12/2005 | Miyamoto | |
| 7,224,389 B2 | 5/2007 | Dierickx | |
| 7,446,807 B2 * | 11/2008 | Hong | 348/308 |
| 2002/0175269 A1 | 11/2002 | Krymski | |
| 2004/0036789 A1* | 2/2004 | Shinohara | 348/308 |
| 2004/0096124 A1 | 5/2004 | Nakamura | |
| 2006/0044438 A1 | 3/2006 | Mauritzson et al. | |
| 2006/0092316 A1 | 5/2006 | Gazeley | |
| 2006/0285000 A1 | 12/2006 | Mabuchi | |

* cited by examiner

*Primary Examiner*—Georgia Y Epps
*Assistant Examiner*—Tony Ko
(74) *Attorney, Agent, or Firm*—Dickstein Shapiro LLP

(57) ABSTRACT

A pixel cell in which a capacitance is coupled between a storage node and a row select transistor and another capacitance is coupled between a storage node and a voltage supply or ground source potential to boost a reset voltage.

16 Claims, 8 Drawing Sheets

IMAGER PIXEL WITH CAPACITANCE CIRCUIT FOR BOOSTING RESET VOLTAGE

CROSS-REFERENCE TO RELATED APPLICATION

This application is a continuation of U.S. application Ser. No. 11/002,281, filed Dec. 3, 2004 now U.S. Pat. No. 7,446,807, the contents of which are incorporated herein by reference in its entirety.

FIELD OF THE INVENTION

The present invention relates to improving the control and operation of an imager pixel.

BACKGROUND OF THE INVENTION

Various imager circuits have been proposed such as charge coupled device (CCD) arrays, complementary metal oxide semiconductor (CMOS) arrays, arrays combining both CCD and CMOS features, as well as hybrid infrared focal-plane arrays (IR-FPAs). Conventional arrays have pixels containing a tight-sensing element, e.g. a photodiode and readout circuitry that outputs signals indicative of the light sensed by the pixels.

A CMOS imager, for example, includes a focal plane array of pixel cells; each cell includes a photodetector (e.g., a photogate, photoconductor or a photodiode) overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a storage region, connected to the gate of the source follower transistor. Charge generated by the photodetector is sent to the storage region. The imager may also include a transistor for transferring charge from the photodetector to the storage region and another transistor for resetting the storage region to a predetermined charge level prior to charge transference.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assisted to Micron. Technology, Inc., which are hereby incorporated by reference in their entirety.

FIG. 1 illustrates a block diagram of a CMOS imager device 100 having a pixel array 105 with each pixel cell being constructed as described above, or as other known pixel cell circuits. Pixel array 105 comprises a plurality of pixels arranged in a predetermined number of columns and rows (not shown). The pixels of each row in array 105 are all turned on at the same time by a row select line, and the pixels of each column are selectively output by respective column select lines. A plurality of row and column lines are provided for the entire array 105. The row lines are selectively activated in sequence by a row driver 110 in response to row address decoder 115. The column select lines are selectively activated in sequence for each row activation by a column driver 120 in response to column address decoder 125. Thus, a row and column address is provided for each pixel.

The CMOS imager 100 is operated by a control circuit 130, which controls address decoders 115, 125 for selecting the appropriate row and column lines for pixel readout Control circuit 130 also controls the row and column driver circuitry 110,120 so that they apply driving voltages to the drive transistors of the selected row and column lines. The pixel output signals typically include a pixel reset signal Vrst taken off of the storage region when it is reset by the reset transistor and a pixel image signal Vsig, which is taken off the storage region after photo-generated charges are transferred to it. The Vrst and Vsig signals are read by a sample and hold circuit 135 and are subtracted by a differential amplifier 140, to produce a differential signal Vrst-Vsig for each pixel. Vrst-Vsig represents the amount of light impinging on the pixels. This difference signal is digitized by an analog-to-digital converter 145. The digitized pixel signals are fed to an image processor 150 to form a digital image output. The digitizing and image processing can be located on or off the imager chip, in some arrangements the differential signal Vrst-Vsig can be amplified as a differential signal and directly digitized by a differential analog to digital converter.

FIG. 2 illustrates a four transistor (4T) CMOS imager pixel cell 200. Pixel cell 200 includes a photodiode 205 connected to a transfer transistor 225. The transfer transistor 225 is also connected to a storage region 220, which may be constructed as a floating diffusion region. A reset transistor 230, a capacitor 215 and a gate of a source follower transistor 240 are connected to storage region 220. A row select transistor 235 is connected to source follower transistor 240. The active elements of pixel cell 200 perform the functions of (1) photon to charge conversion by photodiode 205; (2) resetting the storage region to a known state before the transfer of charge to it by reset transistor 230; (3) transfer of charge to the storage region 220 by the transfer transistor 225; (4) selection of the cell 200 for readout by row select transistor 235; and (5) output and amplification of a signal representing a reset voltage (i.e., Vrst) and a pixel signal voltage (i.e., Vsig) based on the charges present on storage region 220 by source follower transistor 240. Capacitor 215 is utilized because charges produced during an integration period by photodiode 205 may be greater than the capacity of storage region 220. Accordingly, capacitor 215 provides additional charge storage capacity. The pixel cell 200 of FIG. 2 is formed on a semiconductor substrate as part of an imager device pixel array (e.g., array 105 of FIG. 1).

Since transfer transistor 225 is positioned between photodiode 205 and storage region 220, the storage region 220 can be reset prior to transferring electrons to it from the photo diode 205. This permits a correlated double sampling operation resulting in reduced kTC noise and image noise.

With the pixel circuit configuration of FIG. 2 during reset in order to obtain a maximum voltage swing at storage region 220, the reset transistor drain voltage is boosted to Vpix (voltage source 210)+Vt (a threshold voltage drop of reset transistor 230). By adding voltage Vt to the reset voltage as applied to the storage region 220, the storage region 220 can be reset to Vpix allowing a greater output signal swing in the signal produced by the source follower transistor 240 in response to charges transferred to the storage region 220 from photodiode 205. This technique requires additional supply voltage boost circuits to boost the supply voltage for reset which increases the size, power consumption, design complexity and costs of the pixel and associated circuit.

BRIEF SUMMARY OF THE INVENTION

The present invention relates to a pixel circuit having a capacitance circuit for increasing dynamic range by boosting the reset voltage of a floating diffusion region. Various exemplary embodiments of the invention provide for boosting the reset voltage without overboosting and without using an external voltage source for boosting. This is done with a capacitance circuit in exemplary embodiments which uses one capacitor between the floating diffusion region and a voltage source for increasing storage capacity of the storage region and setting conversion gain of the pixel and another capacitor for boosting the reset voltage of the floating diffusion region.

BRIEF DESCRIPTION OF THE DRAWINGS

These and other features and advantages of the invention will be better understood from the following detailed description, which is provided in connection with the accompanying drawings, in which.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood mat other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The term "substrate" is to be understood as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions, junctions of material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell obtaining a photo-conversion device or photosensor, for example, a photogate, photoconductor or a photodiode and transistors for processing an electrical signal from electromagnetic radiation sensed by the photo-conversion device. The embodiments of pixels discussed herein are illustrated and described as employing four transistor (4T) pixel circuits which use a transfer transistor to gate charge from a photosensor to a storage region for the sake of example only. It should be understood that the invention may be used with other pixel arrangements having more or less than four transistors and in arrangements which do not use a transfer transistor. Although capacitances are shown as discreet capacitors, the can also be formed as parasitic capacitances inherent in signal lines or fabrication techniques.

Figure 1:
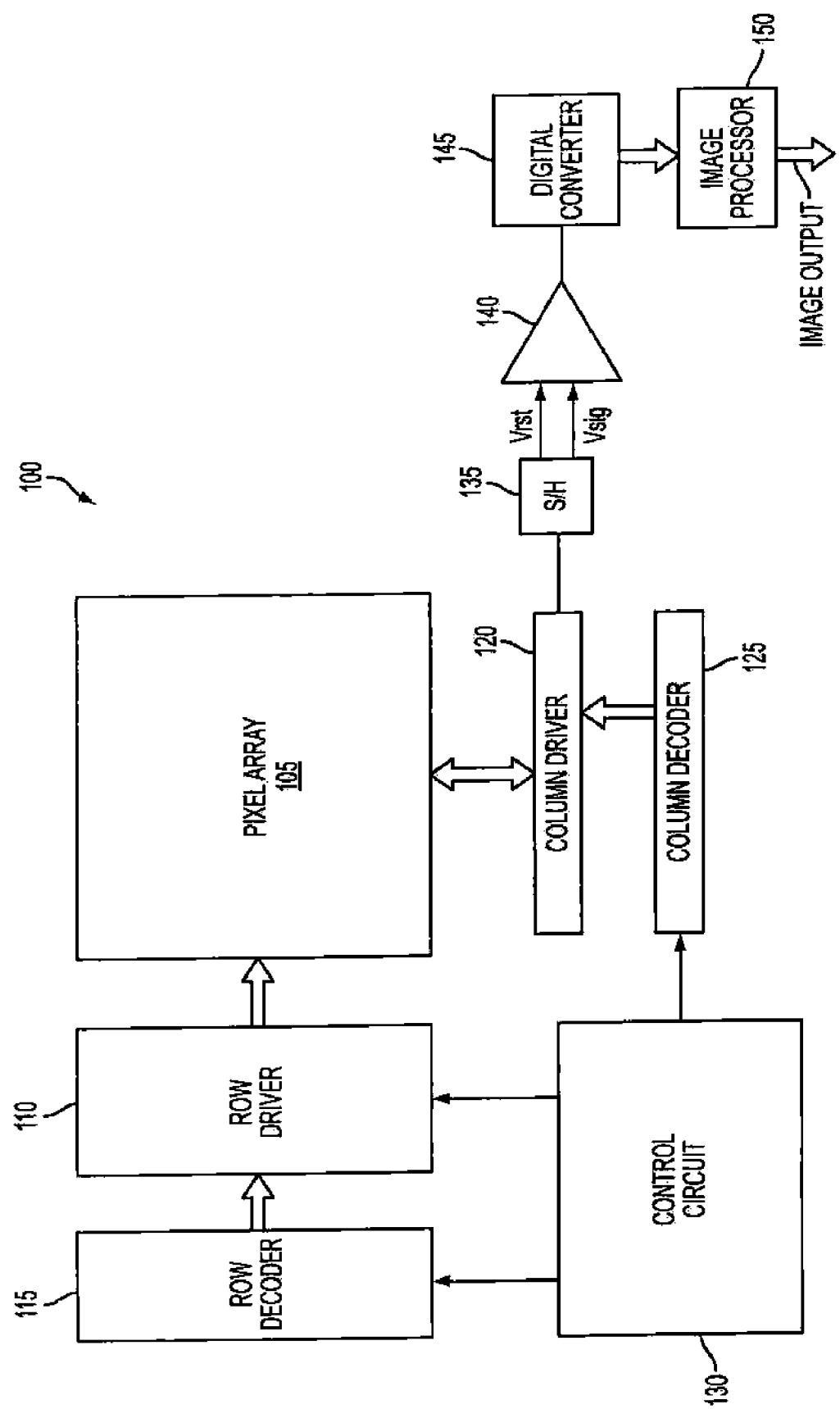
FIG. 1 is a block diagram of a conventional imager device.

Although the invention is described herein with reference to the architecture and fabrication of one pixel cell, it should be understood that this is representative of a plurality of pixels in an array of an imager device such as array 105 of imager device 100 (FIG. 1). In addition, although the invention is described below with reference to a CMOS imager, the invention has applicability to any solid state imaging device having a storage node which is reset and then has charges transferred to it. The following detailed description is, therefore, not to be taken in a limiting sense, and the scope of the present invention is defined only by the appended claims.

Figure 3A:
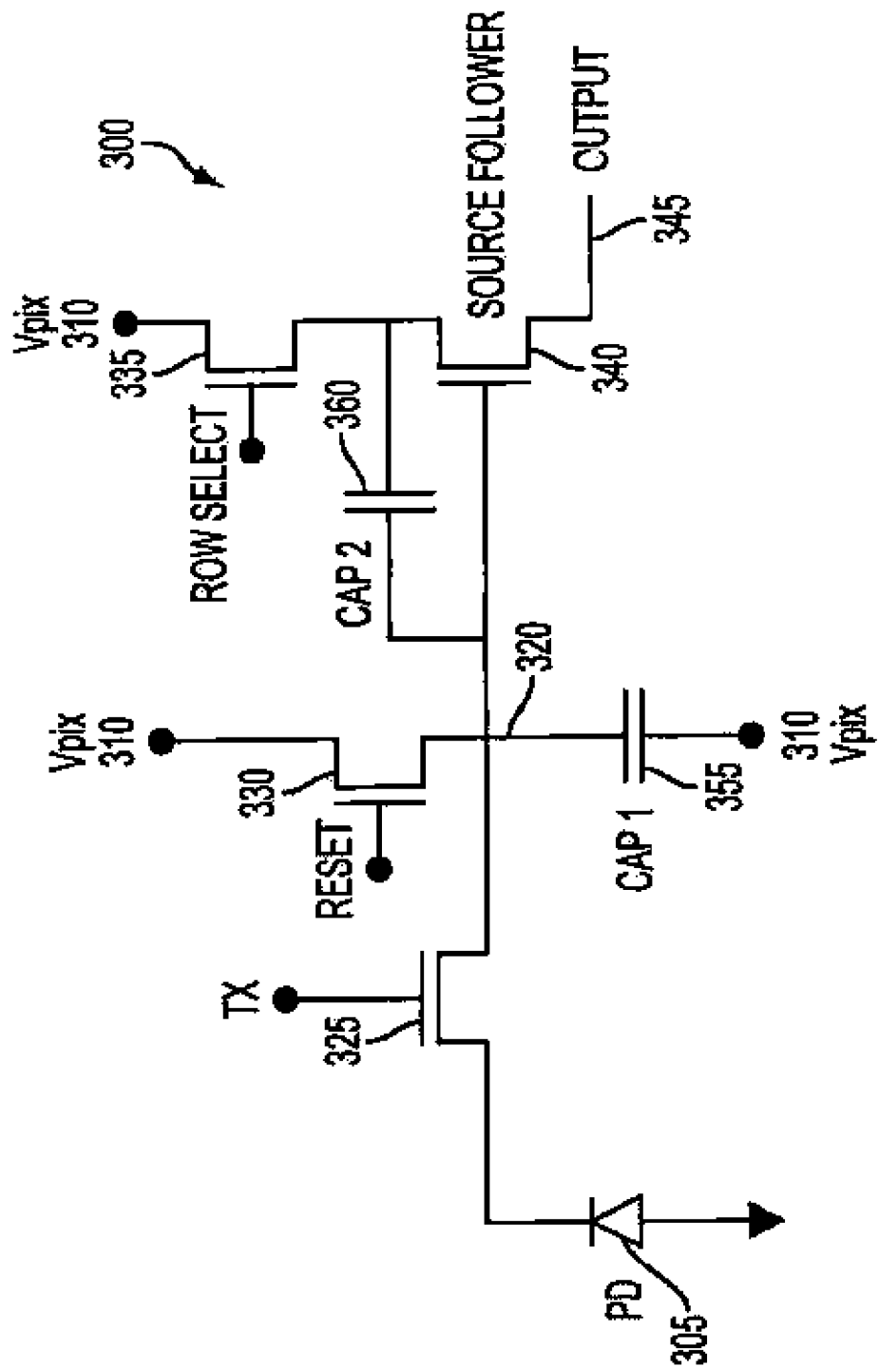
FIGS. 3a, 3b, and 3c are schematic circuit diagrams according to exemplary embodiments of the invention.

FIG. 3a illustrates a pixel circuit 300 according to a first exemplary embodiment of the invention. Pixel circuit 300 includes a photodiode 305 connected to a transfer transistor 325. The transfer transistor 325 is also connected to storage region 320, for example, a floating diffusion region. A reset transistor 330 and a source follower transistor 340 are connected to storage region 220. However, unlike circuit 200, the drain of row select transistor 335 is connected to voltage source 310 and the source is connected to source follower transistor 340. Also, there are two capacitors, 355 and 360, rather than the single capacitor of circuit 200. One end of first capacitor 355 is connected to storage region 320, with the other end connected to voltage source 310. One end of second capacitor 360 is connected to the source of the row select transistor 335, while the other is connected to the storage region 320. With this arrangement, when the row select transistor 335 is first turned on, a voltage boost is applied to the storage region 320. If the reset transistor 330 is pulsed (on/off) just prior to the row select transistor 335, the storage region will see both the reset voltage applied by reset transistor 330 and the voltage boost caused by the turn on of the row select transistor 335. Other voltage pulse coupling devices may be utilized instead of second capacitor 360, such as a reverse biased diode.

Figure 2:
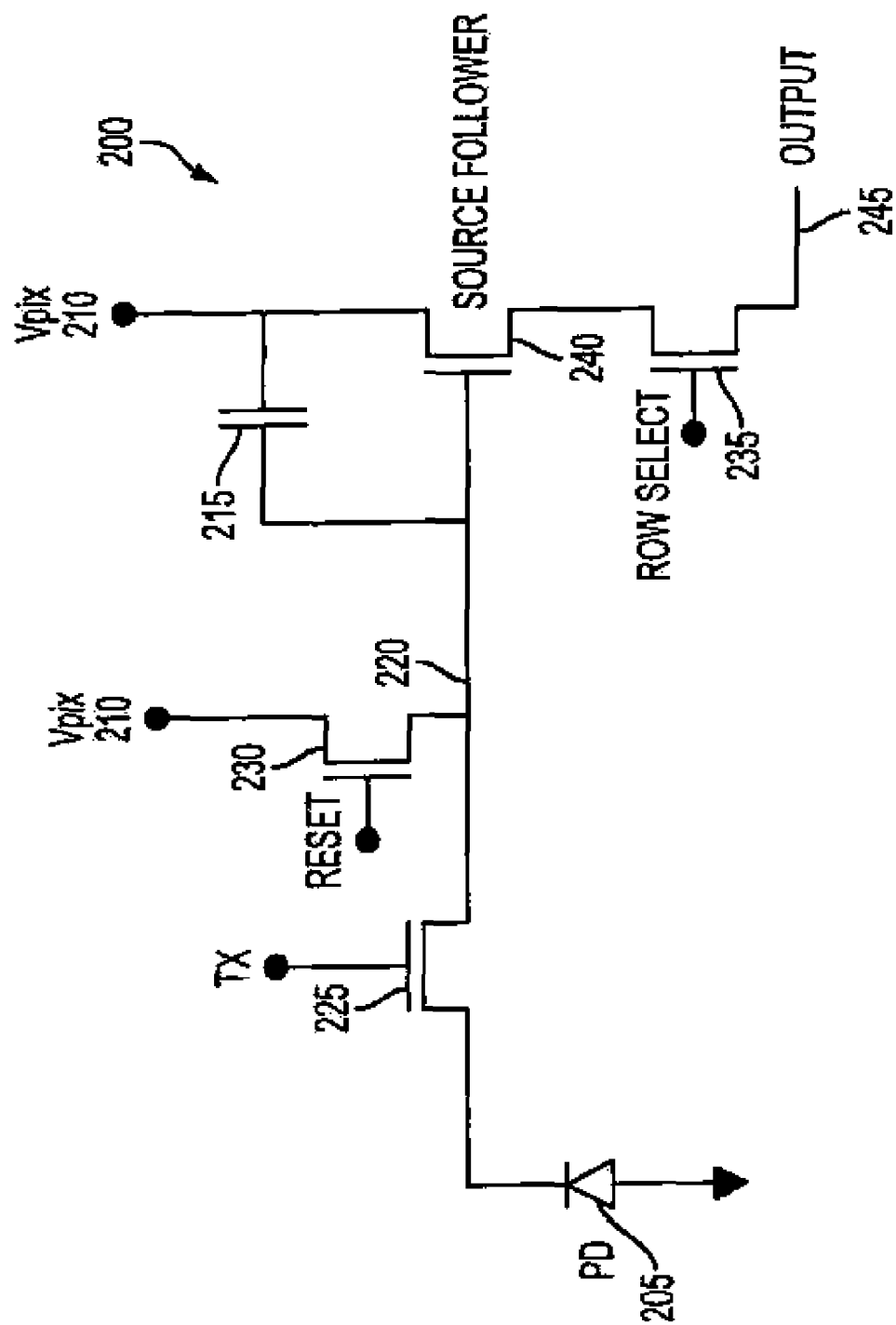
FIG. 2 is a schematic diagram of a conventional four transistor pixel.

As noted above with respect to the pixel readout of circuit 200 (FIG. 2), the reset voltage level is created by turning on the reset transistor 225 thereby resetting the storage region 220. The reset voltage level is applied to the gate of the source follower transistor 240, which converts it to a reset output voltage Vrst on a column output Bne. The boosted voltage provided through capacitor 360 by turning on the row select transistor is also applied to the storage region 220 and gate of source follower transistor 240. The pixel circuit 300 provides a boosted reset signal, which is sampled to provide Vrst.

The reset signal on the storage region 320 is boosted due to the operation of capacitor 360 when the row select transistor 335 turns on in response to the leading edge of a row select pulse. The capacitor 355 provides additional storage for the storage region 320 and can have a value selected to provide a particular conversion gain for the pixel circuit.

Figure 3B:
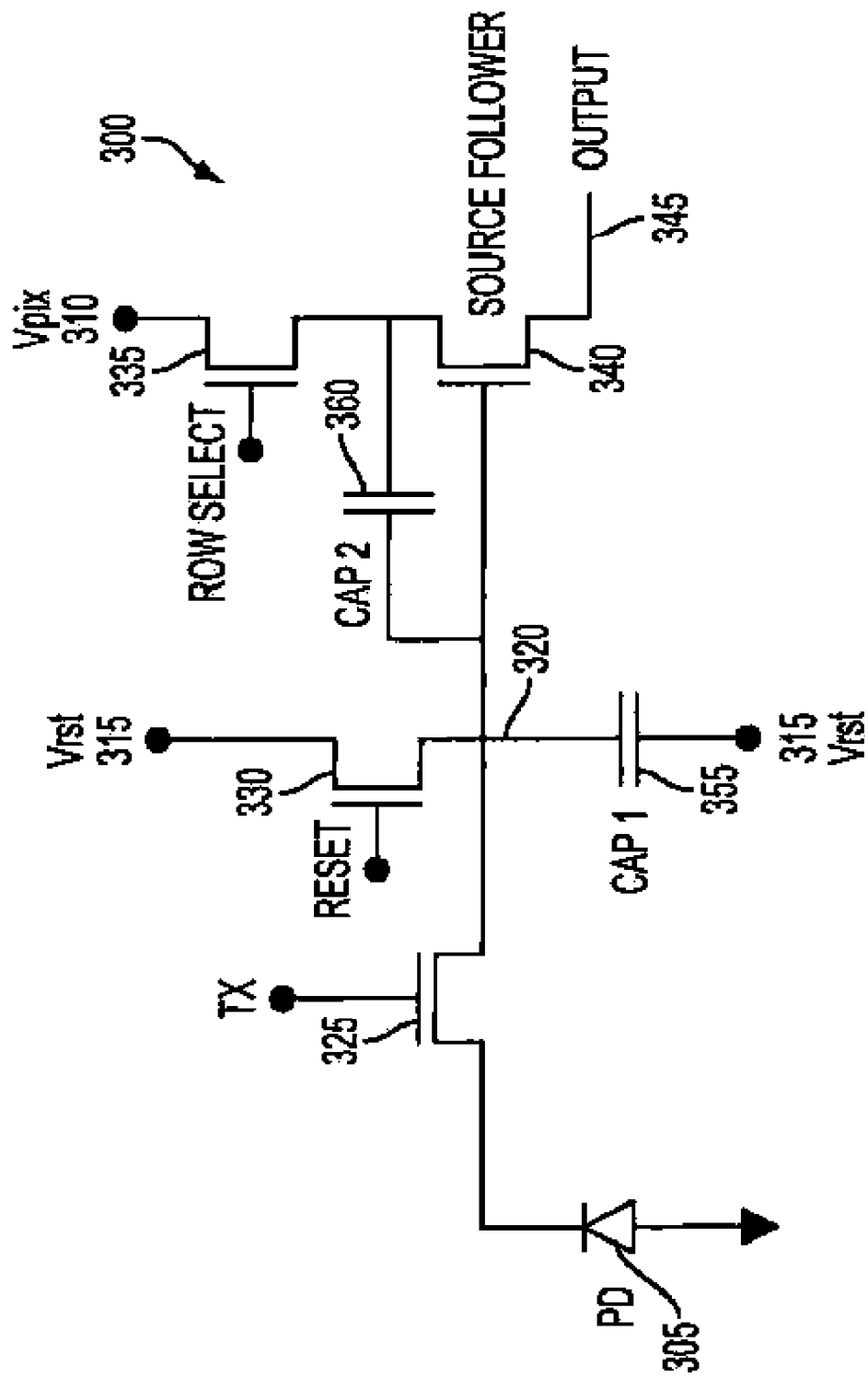
Figure 3C:
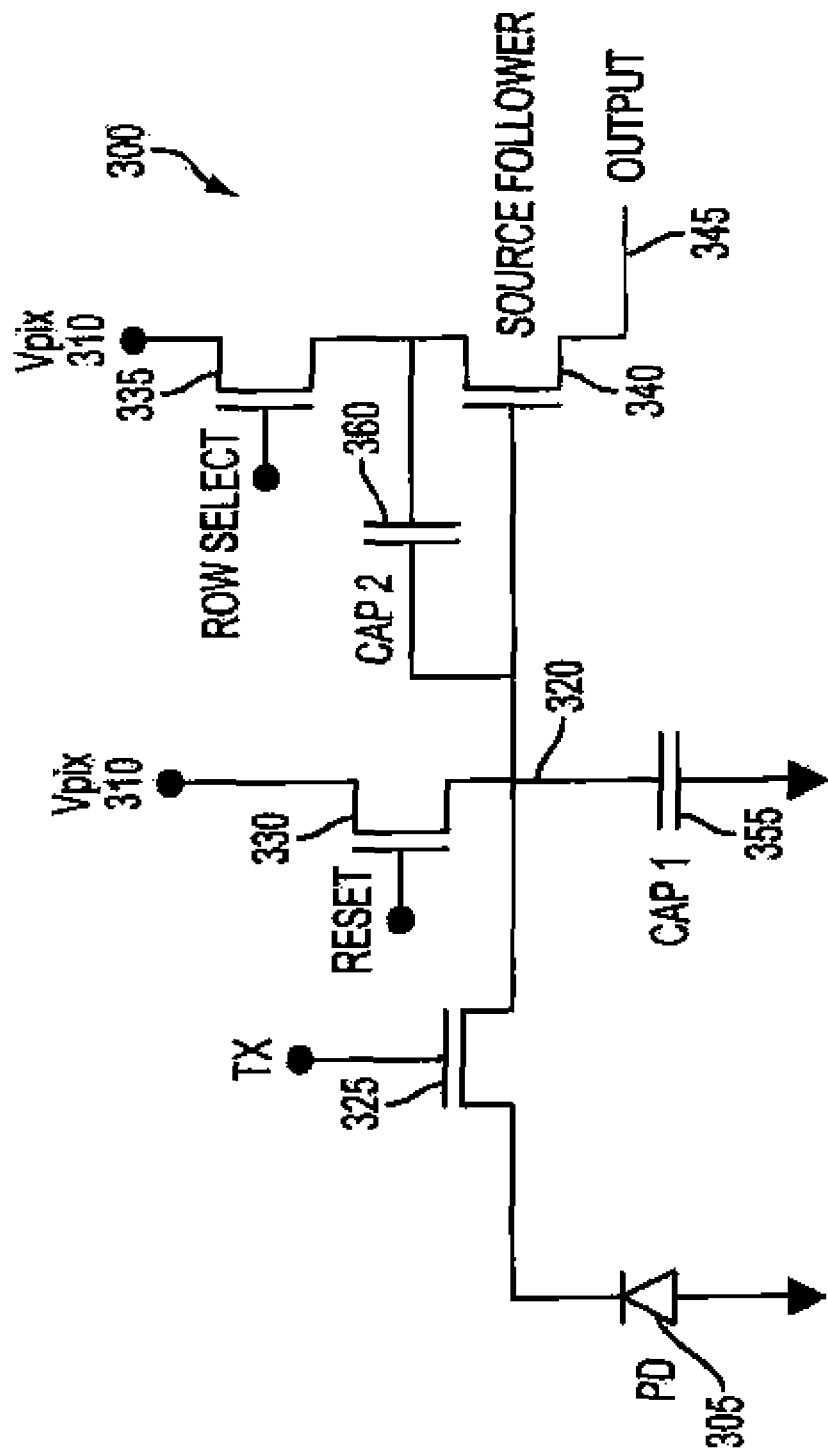

FIG. 3b illustrates another embodiment of the present invention, wherein first capacitor 355 is tied at one end to storage region 320, and at the other end to a voltage supply different from pixel voltage supply 310, in (his case a reset voltage supply 315. FIG. 3c shows yet another embodiment of the present invention in which first capacitor 355 is tied at one end to storage region 320, and at the other end to a ground source potential. In this embodiment, the reset transistor is coupled to the pixel supply voltage; however, it may also be coupled to a separate reset supply voltage Vrst as in the FIG. 3a embodiment.

Figure 4:
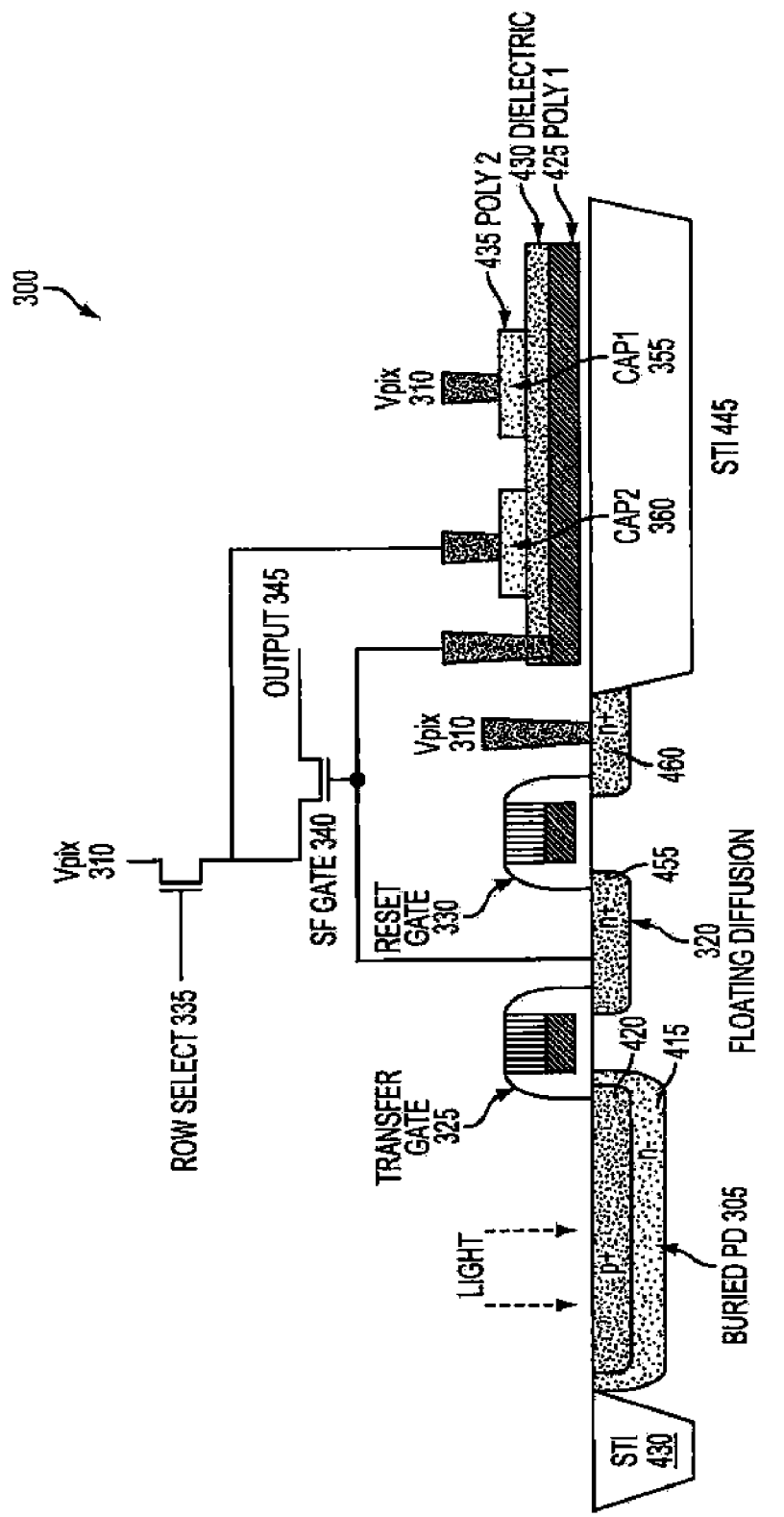
FIG. 4 is a cross-sectional view of an exemplary embodiment of a silicon wafer layout for a pixel circuit in accordance with the present invention.

FIG. 4 shows a cross-section of an exemplary integrated circuit layout of the pixel circuit of FIG. 3a. The circuit is formed on p-type substrate 410. Left shallow trench isolation (STI) region 440 and right STI region 445 define the boundaries of the pixel. Photodiode 305 comprises p+ region 420 over n− region 415 within the p-type substrate 410. Floating diffusion region 320 is situated at n+ region 455 which is between the gate of transfer transistor 325 and the gate of reset transistor 330. Reset transistor 330 is connected to pixel supply voltage 310 at n+ drain region 460. First capacitor 355 and second capacitor 360 are formed by first doped polysilicon layer 425 acting as a common electrode for both capacitors, dielectric 430, and second doped polysilicon layer 435, where the second doped polysilicon layer 435 is segmented to form the respective capacitor top electrodes. Therefore, capacitors 355 and 360 share one common electrode and have respective second electrodes. Capacitors 355 and 360 are at least partially formed Over a pixel isolated region.

Figure 5:
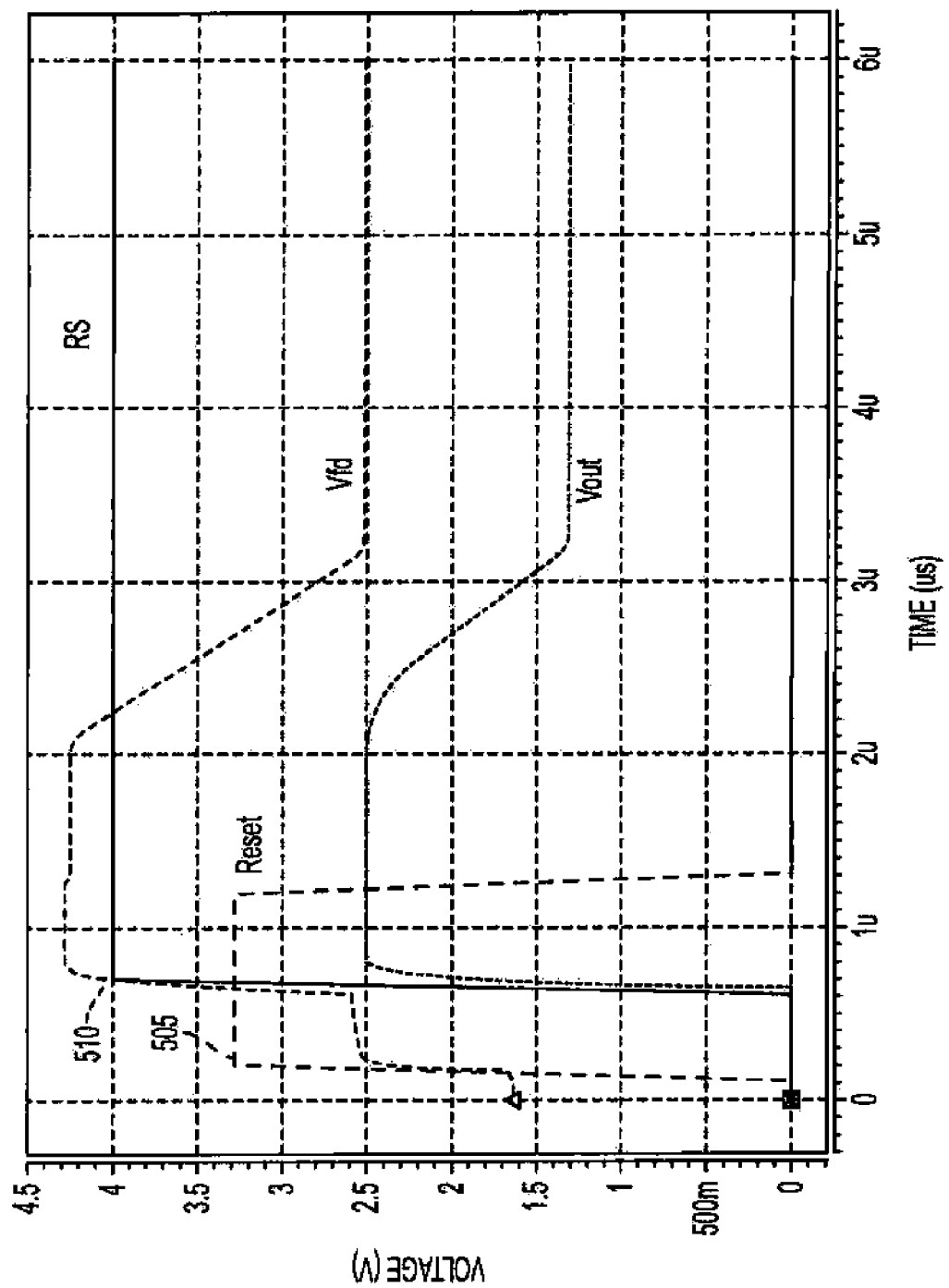
FIG. 5 is a graph illustrating the boosting of the floating diffusion region voltage.

FIG. 5 shows the boost in reset voltage produced by the FIG. 4 pixel circuit. In FIG. 5, when reset control signal reset is activated to turn on the reset transistor 330 as shown at point 505, the floating diffusion region voltage Vfd is raised to roughly the supply voltage Vpix less the threshold voltage drop of the reset transistor 330. Since at this time the row select transistor is off, the output voltage at the source follower transistor 340 is zero. When the row select transistor then turns on by the pulse signal Row Select, additional reset voltage is supplied to the floating diffusion region by capacitor 360, causing the floating diffusion region voltage Vfd to increase as shown at 510. At the same time, the source follower transistor 340 now turns on and its output follows the boosted Vfd of the floating diffusion region.

Figure 6:
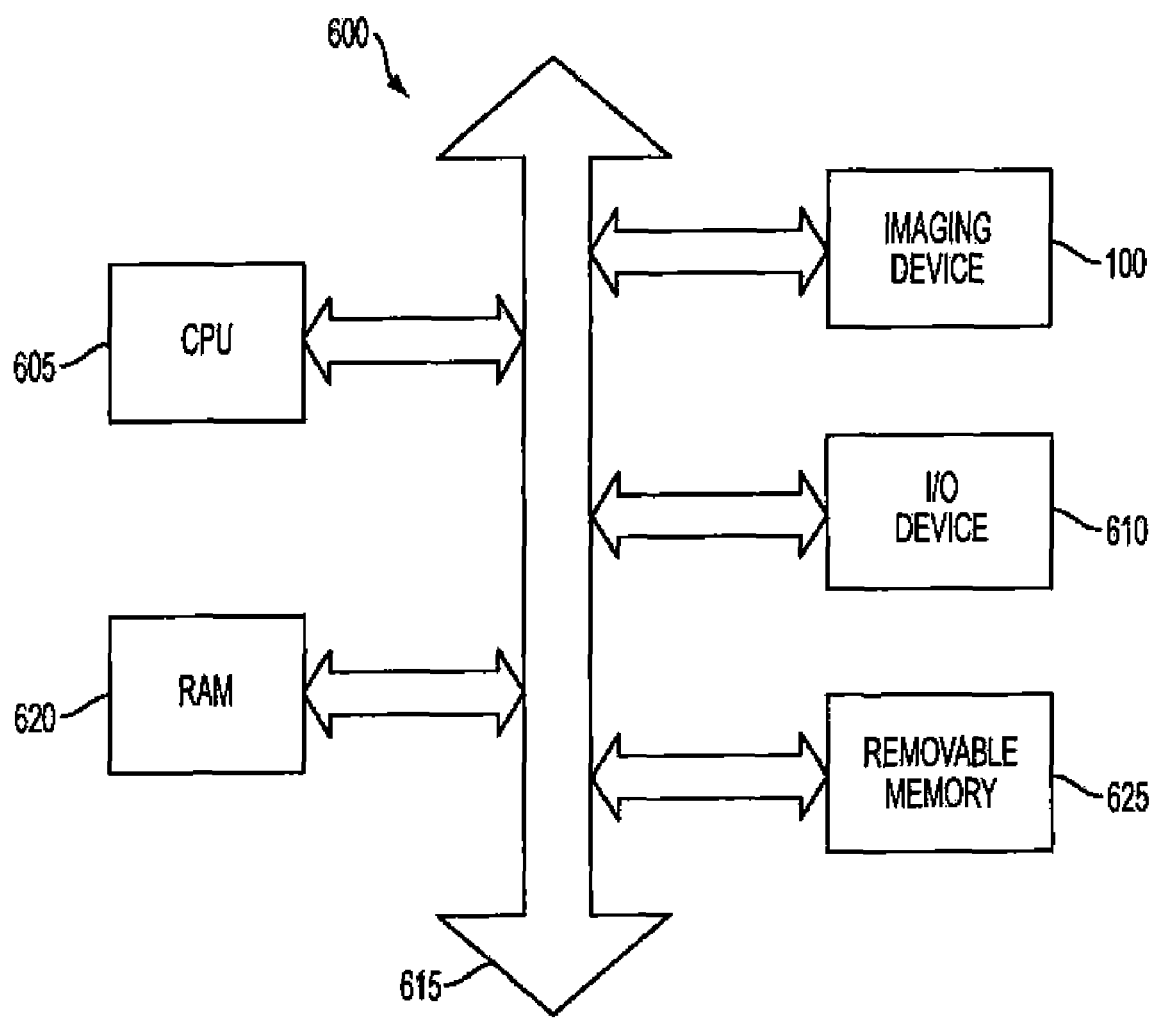
FIG. 6 shows a processor system incorporating at least one imaging device constructed in accordance with an embodiment of the invention.

The various illustrated exemplary embodiments of the invention provide one capacitor, e.g. capacitor 355 in FIG. 3a, for storing charge and setting conversion gain for the floating diffusion region 320, and a second capacitor, e.g. capacitor 360 in FIG. 3b, for boosting the reset voltage of the floating diffusion region 320 to increase the dynamic range of a pixel. FIG. 6 illustrates a processor-based system 600 including an imaging device 100 of FIG. 1 modified to contain pixels in the array 105 which are constructed in accordance with the invention. The processor-based system 600 is exemplary of a system utilizing an imaging device 100 which includes a pixel array having pixels constructed and operated in accordance with the invention. Without being limiting, such a system could include a camera system, computer system, scanner, machine vision system, vehicle navigation system, videophone, and others.

The processor-based system 600, for example a camera system, generally comprises a central processing unit (CPU) 605, such as a microprocessor, that communicates with an input/output (I/O) device 510 over a bus 615. Imaging device 100 also communicates with the CPU 605 over bus 615. The processor-based system 600 also includes random access memory (RAM) 620, and can include removable memory 625, such as flash memory, which also communicate with CPU 605 over the bus 615. Imaging device 100 may be combined with a processor, such as a CPU, digital signal processor, or microprocessor, with or without memory storage on a single integrated circuit or on a different chip than the processor.

Various embodiments of the invention have been illustrated using a photodiode as the charge conversion device, and in the environment of a four transistor pixel. However, it should be appreciated that the invention is not so limited and can be used in any pixel architecture employing a row select transistor and source follower transistor coupled in the fashion similar to the circuit described above, which is used for eliminating the need to boost the supply voltage to produce a reset voltage on the storage region. Also, other types of photosensors may be used to generate image charge. The invention may also be used in a readout circuit for a CCD (charge coupled device) array. Accordingly, it is not intended that the present invention be strictly limited to the above-described and illustrated embodiment. Any modifications of the present invention as described in the embodiments herein that falls within the spirit and scope of the following claims should be considered part of the present invention.

What is claimed as new and desired to be protected by Letters Patent of the United States is:

1. A pixel circuit comprising:
   a photo-conversion device;
   a floating diffusion region for receiving and storing charge from said photo-conversion device;
   a reset transistor for resetting said floating diffusion region to a reset voltage state;
   a first capacitance circuit coupled to said floating diffusion region for storing charge received from said photo-conversion device;
   a readout circuit for reading out a signal based on charges stored at said floating diffusion region; and
   a voltage boost circuit operating in response to a switching state of a switching device of said pixel circuit for boosting a reset voltage on said floating diffusion region above said reset voltage state, said voltage boost circuit comprising a second capacitance circuit.

2. The pixel circuit of claim 1, wherein said voltage boost circuit is coupled between said floating diffusion region and said readout circuit.

3. The pixel circuit of claim 1, wherein said second capacitance circuit comprises a capacitor.

4. The pixel of claim 3, wherein said capacitor is at least partially formed over a pixel isolated region.

5. The pixel circuit of claim 1, further comprising a transfer transistor for delivering said charge from said photo-conversion device to said floating diffusion region.

6. The pixel circuit of claim 1, further comprising a row select transistor acting as a switching device coupled to said voltage boost circuit.

7. The pixel circuit of claim 1, further comprising a source follower transistor coupled to said floating diffusion region.

8. The pixel circuit of claim 1, wherein said photo-conversion device comprises a photodiode.

9. A method of fabricating an integrated circuit comprising:
   forming a photo-conversion device;
   forming a floating diffusion region for receiving and storing charge from said photo-conversion device;
   forming a reset transistor for resetting said floating diffusion region to a reset voltage state;
   forming a first capacitance circuit coupled to said floating diffusion region for storing charge received from said photo-conversion device;
   forming a readout circuit for reading out a signal based on charges stored at said floating diffusion region; and
   forming a voltage boost circuit operating in response to a switching state of a switching device of said pixel circuit for boosting a reset voltage on said floating diffusion region above said reset voltage state, voltage boost circuit comprising a second capacitance circuit.

10. The method of claim 9, wherein said step of forming a voltage boost circuit comprises coupling said voltage boost circuit to said floating diffusion region and to said readout circuit.

11. The method of claim 9, further comprising a step of forming a transfer transistor for delivering said charge from said photo-conversion device to said floating diffusion region.

12. The method of claim 9, further comprising a step of forming a row select transistor coupled to said voltage boost circuit.

13. The method of claim 9, further comprising a step of forming a source follower transistor coupled to said floating diffusion region.

14. A method of operating a pixel comprising the steps of:
receiving light in a photo-conversion device, said photo-conversion device converting said light into electrical charge;
resetting a floating diffusion region to a reset voltage state;
boosting a voltage on said floating diffusion region above said reset voltage state to a boosted reset voltage with a first capacitance circuit operating in response to a switching state of a switching device;
reading out said boosted reset voltage;
storing charge from said photo-conversion device in said floating diffusion region and in a second capacitance circuit coupled to said floating diffusion region; and
reading out a signal based on stored charge at said floating diffusion region from said photo-conversion device.

15. The method of claim 14, further comprising a step of delivering said charge from said photo-conversion device through a transfer transistor to said floating diffusion region.

16. The method of claim 14, further comprising operating a row select transistor to generate a boosted voltage at said floating diffusion region.

* * * * *